US011394284B2

(12) United States Patent
Suzuki et al.

(10) Patent No.: US 11,394,284 B2
(45) Date of Patent: Jul. 19, 2022

(54) ACTUATOR DEVICE

(71) Applicant: HAMAMATSU PHOTONICS K.K., Hamamatsu (JP)

(72) Inventors: Daiki Suzuki, Hamamatsu (JP); Takuma Osaki, Hamamatsu (JP); Yasuyuki Sakakibara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 238 days.

(21) Appl. No.: 16/767,027

(22) PCT Filed: Nov. 26, 2018

(86) PCT No.: PCT/JP2018/043412
§ 371 (c)(1),
(2) Date: May 26, 2020

(87) PCT Pub. No.: WO2019/107311
PCT Pub. Date: Jun. 6, 2019

(65) Prior Publication Data
US 2021/0036592 A1 Feb. 4, 2021

(30) Foreign Application Priority Data

Dec. 1, 2017 (JP) .............................. JP2017-232057

(51) Int. Cl.
*H02K 33/00* (2006.01)
*H02K 33/02* (2006.01)
*G02B 26/08* (2006.01)

(52) U.S. Cl.
CPC ........... *H02K 33/02* (2013.01); *G02B 26/085* (2013.01)

(58) Field of Classification Search
CPC .... G02B 3/0072; G02B 26/085; G02B 26/10; G02B 26/105; G02B 27/0176;
(Continued)

(56) References Cited

U.S. PATENT DOCUMENTS 5,969,465 A * 10/1999 Neukermans ......... B81B 3/0078
310/40 MM
5,999,303 A * 12/1999 Drake .................... H02N 1/008
(Continued)

FOREIGN PATENT DOCUMENTS

EP  0774681 A1  5/1997
EP  1172677 A2  1/2002
(Continued)

OTHER PUBLICATIONS

International Preliminary Report on Patentability dated Jun. 11, 2020 for PCT/JP2018/043412.

*Primary Examiner* — Maged M Almawri
(74) *Attorney, Agent, or Firm* — Faegre Drinker Biddle & Reath LLP

(57) ABSTRACT

An actuator device includes a support part, a first movable part, a second movable part, a first connecting part connecting the first movable part to the second movable part, a second connecting part connecting the second movable part to the support part, a spiral coil provided to the second movable part a first external terminal provided to the support part, and a first wiring connected to an inner end portion of the coil and the first external terminal. The first wiring includes a lead wiring connected to the first external terminal, and a straddle wiring provided to the second movable part so as to straddle the coil and connected to the inner end of the coil and the lead wiring. The width of the straddle wiring is larger than the width of the coil, and the thickness of the straddle wiring is smaller than the thickness of the coil.

16 Claims, 8 Drawing Sheets

(58) Field of Classification Search
CPC ............ Y10T 74/10; B81B 2203/0154; B81B 3/0078; B81B 3/0045; B81B 3/0072
USPC .................. 310/15, 300–309, 12.03, 40 mm; 359/196.1, 199.4, 201.2, 203.1, 197.1, 359/223.1, 224.1, 211.5
See application file for complete search history.

(56) References Cited

U.S. PATENT DOCUMENTS

| | | | | |
|---|---|---|---|---|
| 6,188,504 B1* | 2/2001 | Murakami | ........... | G02B 7/1821 359/224.1 |
| 6,232,861 B1* | 5/2001 | Asada | ................... | B81B 3/0062 335/229 |
| 6,392,220 B1* | 5/2002 | Slater | ................ | H04Q 11/0005 73/514.01 |
| 7,233,343 B2* | 6/2007 | Turner | .................... | B41J 2/465 347/243 |
| 7,821,694 B2* | 10/2010 | Asai | ................... | G02B 26/0858 359/224.1 |
| 7,872,394 B1* | 1/2011 | Gritters | ................. | H02N 1/006 310/309 |
| 8,203,290 B2* | 6/2012 | Matsubara | ........... | H02P 25/032 318/128 |
| 8,654,426 B2* | 2/2014 | Yamada | ............. | G02B 26/0858 359/212.1 |
| 8,837,029 B2* | 9/2014 | Yamada | ............... | G02B 26/101 359/212.1 |
| 9,291,815 B2* | 3/2016 | Horie | .................. | G02B 26/105 |
| 10,330,923 B2* | 6/2019 | Hino | .................. | G02B 27/0172 |
| 10,589,985 B2* | 3/2020 | Takimoto | ............... | G02B 26/08 |
| 11,199,695 B2* | 12/2021 | Suzuki | .................. | G02B 26/10 |
| 2001/0022682 A1* | 9/2001 | McClelland | ....... | G02B 26/0841 359/290 |
| 2002/0130561 A1* | 9/2002 | Temesvary | ........... | G02B 6/3518 310/12.13 |
| 2004/0256921 A1* | 12/2004 | Turner | ................. | H02P 25/032 310/36 |
| 2005/0200986 A1* | 9/2005 | Tsuboi | ................... | G02B 26/0841 359/871 |
| 2005/0219674 A1* | 10/2005 | Asai | ................... | G02B 26/0833 359/213.1 |
| 2006/0071578 A1* | 4/2006 | Drabe | ................. | G01C 19/5642 310/309 |
| 2006/0125346 A1* | 6/2006 | Yoda | .................. | G02B 26/0841 359/290 |
| 2006/0152785 A1* | 7/2006 | Yasuda | ................ | G02B 26/105 359/224.1 |
| 2007/0017994 A1* | 1/2007 | Wolter | .................... | B81B 3/007 235/462.37 |
| 2007/0222334 A1* | 9/2007 | Wan | ........................ | H01G 5/18 361/278 |
| 2008/0054758 A1* | 3/2008 | Tsuboi | .................. | H02N 1/008 310/309 |
| 2008/0278785 A1* | 11/2008 | Klose | ................. | G02B 26/0833 359/213.1 |
| 2010/0097681 A1* | 4/2010 | Klose | .................... | B81B 3/0062 318/116 |
| 2010/0259806 A1* | 10/2010 | Tauscher | ............ | H04M 1/0272 359/198.1 |
| 2011/0102870 A1* | 5/2011 | Nakamura | ........... | G02B 26/085 359/198.1 |
| 2012/0062970 A1* | 3/2012 | Yamada | ............... | G02B 7/1821 310/323.01 |
| 2012/0162739 A1* | 6/2012 | Yamada | ................ | G02B 26/10 359/212.1 |
| 2012/0228460 A1* | 9/2012 | Suzuki | .................. | H02N 2/046 248/474 |
| 2012/0257235 A1* | 10/2012 | Hino | ........................ | H04N 3/08 359/213.1 |
| 2014/0340726 A1* | 11/2014 | Gu-Stoppel | ........ | G02B 26/0833 359/224.1 |
| 2015/0203346 A1* | 7/2015 | Fujimoto | .............. | B81B 3/0072 74/1 SS |
| 2016/0105090 A1* | 4/2016 | Sadaharu | ............. | G02B 26/101 310/38 |
| 2017/0102538 A1* | 4/2017 | Gamet | ................. | G02B 26/101 |
| 2019/0016589 A1* | 1/2019 | Takimoto | ............. | G02B 26/085 |

FOREIGN PATENT DOCUMENTS

| | | | | |
|---|---|---|---|---|
| EP | 1524537 A1 | | 4/2005 | |
| JP | 2009-251002 A | | 10/2009 | |
| JP | 2009251002 | * | 10/2009 | .............. B81B 3/00 |
| JP | 2014-041234 A | | 3/2014 | |
| JP | 2017-129782 A | | 7/2017 | |
| JP | 2017-181710 A | | 10/2017 | |
| WO | WO 2012/130612 A1 | | 10/2012 | |
| WO | WO-2014/162521 A1 | | 10/2014 | |
| WO | WO-2015/015666 A1 | | 2/2015 | |
| WO | WO-2017126289 A1 | * | 7/2017 | .............. B81B 3/00 |

* cited by examiner

ACTUATOR DEVICE

TECHNICAL FIELD

An aspect of the disclosure relates to an actuator device formed of, for example, a Micro Electro Mechanical Systems (MEMS) device.

BACKGROUND ART

An actuator device is known as a MEMS device. The actuator device includes a support part, a first movable part, a frame-shaped second movable part that surrounds the first movable part, a first connecting part that connects the first movable part to the second movable part so that the first movable part can swing around a first axis, a second connecting part that connects the second movable part to the support part so that the second movable part can swing around a second axis orthogonal to the first axis, a coil provided in the second movable part, and a magnetic field generator that generates a magnetic field to act on the coil (see, for example, Patent Literature 1).

CITATION LIST

Patent Literature

Patent Literature 1: Japanese Unexamined Patent Publication No. 2014-41234

SUMMARY OF INVENTION

Technical Problem

When a drive signal having a frequency equal to the resonant frequency of the first movable part around the first axis is input to the coil in the above-mentioned actuator device, the second movable part slightly vibrates around the first axis at this frequency. This vibration is transmitted to the first movable part through the first connecting part, so that the first movable part can swing around the first axis at this frequency. However, it is difficult to obtain a large driving force in such a driving method in comparison with a case where the first movable part is driven by, for example, a coil provided in the first movable part. It is conceivable to increase the number of turns of the coil to increase a driving force. However, since the size of the second movable part should be increased to ensure a space where the coil is arranged, it is difficult for the second movable part to vibrate. For this reason, the amount of current input to the coil needs to be increased to increase a driving force. Since the heating amount is also increased when the amount of current is increased in general, it is required to cope with the increase in the heating amount. Further, the improvement of reliability and the facilitation of manufacture are required for the above-mentioned actuator device.

An object of an aspect of the disclosure is to provide an actuator device that can suppress an increase in the heating amount even though the amount of current input to a coil is increased and can achieve the improvement of reliability and the facilitation of manufacture.

Solution to Problem

An actuator device according to an aspect of the disclosure includes a support part, a first movable part, a frame-shaped second movable part that is arranged so as to surround the first movable part, a first connecting part that connects the first movable part to the second movable part so that the first movable part can swing around a first axis, a second connecting part that connects the second movable part to the support part so that the first movable part can swing around the first axis by the vibration of the second movable part, a spiral coil that is provided in the second movable part, a magnetic field generator that generates a magnetic field to act on the coil, a first external terminal that is provided on the support part, and a first wiring that is connected to an inner end portion of the coil and the first external terminal. The first wiring includes a lead wiring that is connected to the first external terminal, and a straddle wiring that is provided on the second movable part so as to straddle the coil and is connected to the inner end portion of the coil and the lead wiring. The width of the straddle wiring is larger than the width of the coil, and the thickness of the straddle wiring is smaller than the thickness of the coil.

In this actuator device, the inner end portion of the coil and the lead wiring are connected to each other by the straddle wiring that is provided to the second movable part so as to straddle the coil. The width of the straddle wiring is larger than the width of the coil, and the thickness of the straddle wiring is smaller than the thickness of the coil. Accordingly, since the wiring resistance of the straddle wiring can be reduced, an increase in the heating amount can be suppressed even though the amount of current input to the coil is increased. Further, since the width of the straddle wiring is larger than the width of the coil, the straddle wiring can be stably arranged. Accordingly, reliability can be improved. Furthermore, since the thickness of the straddle wiring is smaller than the thickness of the coil, the formation of irregularities on the surface of the second movable part caused by the straddle wiring can be suppressed. Accordingly, manufacture can be facilitated. Therefore, according to the actuator device, an increase in the heating amount can be suppressed even though the amount of current input to the coil is increased, and the improvement of reliability and the facilitation of manufacture can be achieved.

In the actuator device according to the aspect of the disclosure, the length of a contact region between the coil and the straddle wiring may be larger than the width of the coil. In this case, contact resistance between the coil and the straddle wiring can be reduced, so that an increase in the heating amount can be effectively suppressed.

In the actuator device according to the aspect of the disclosure, the width of a contact portion between the lead wiring and the straddle wiring may be larger than the width of the coil. In this case, contact resistance between the lead wiring and the straddle wiring can be reduced, so that an increase in the heating amount can be more effectively suppressed.

In the actuator device according to the aspect of the disclosure, the cross-sectional area of the straddle wiring may be larger than the cross-sectional area of the coil. In this case, an increase in the heating amount can be still more effectively suppressed.

In the actuator device according to the aspect of the disclosure, the width of the straddle wiring may be larger than the width of an arrangement region of the coil. According to this, an increase in the heating amount can be still more effectively suppressed.

In the actuator device according to the aspect of the disclosure, the coil may be embedded in the second movable part, and the straddle wiring may be formed in the shape of a flat layer and may extend so as to straddle the upper side of the coil. In this case, the coil can be stably arranged, so that reliability can be further improved. Furthermore, since the formation of irregularities on the surface of the second movable part caused by the straddle wiring can be effectively suppressed, manufacture can be further facilitated.

In the actuator device according to the aspect of the disclosure, the coil may be arranged on the second movable part and the straddle wiring may extend between the coil and the second movable part so as to straddle the lower side of the coil. In this case, the straddle wiring can be protected.

The actuator device according to the aspect of the disclosure may further include a second external terminal that is provided on the support part and a second wiring that is connected to an outer end portion of the coil and the second external terminal. The actuator device may include a pair of the second connecting parts, the first wiring may extend to the first external terminal from the inner end portion of the coil through one of the pair of the second connecting parts, and the second wiring may extend to the second external terminal from the outer end portion of the coil through the other of the pair of the second connecting parts. In this case, since the first wiring passes through one second torsion bar and the second wiring passes through the other second connecting part, the heating amount can be uniformized between the pair of the second connecting parts in comparison with, for example, a case where both the first wiring and the second wiring pass through one second connecting part.

In the actuator device according to the aspect of the disclosure, the second movable part may be provided with a dummy coil for adjusting a mass balance with the coil at a position to which the coil virtually extends spirally from the inner end portion. In this case, the mass balance of the second movable part can be improved.

In the actuator device according to the aspect of the disclosure, the second movable part may be provided with a dummy straddle wiring for adjusting a mass balance with the straddle wiring. In this case, the mass balance of the second movable part can be improved.

In the actuator device according to the aspect of the disclosure, the dummy straddle wiring may be arranged symmetrically to the straddle wiring with respect to the center of the second movable part when viewed in a direction orthogonal to a plane where the coil is arranged. In this case, the mass balance of the second movable part can be effectively improved.

The actuator device according to the aspect of the disclosure may include a pair of the coils, and the pair of the coils may be alternately arranged side by side in a width direction of the second movable part when viewed in a direction orthogonal to a plane where the coils are arranged. In this case, the first movable part can be suitably driven.

In the actuator device according to the aspect of the disclosure, one of the pair of the coils may be arranged at a position to which the other of the pair of the coils virtually extends spirally from the inner end portion. In this case, one of the pair of the coils can be arranged closer to the outside, so that a driving force can be increased.

In the actuator device according to the aspect of the disclosure, the second connecting part may connect the second movable part to the support part so that the second movable part can swing around a second axis orthogonal to the first axis. In this case, the second movable part can swing around the second axis together with the first movable part.

In the actuator device according to the aspect of the disclosure, the first wiring at the support part may include a plurality of wiring portions that are connected in parallel to each other. In this case, the wiring resistance at the first wiring of the support part can be reduced, so that an increase in the heating amount can be still more effectively suppressed.

The actuator device according to the aspect of the disclosure may further include a pair of wires that is connected to the first external terminal and leads to the outside. In this case, the wiring resistance of the wires led out of the first external terminal can be reduced, so that an increase in the heating amount can be still more effectively suppressed.

Advantageous Effects of Invention

According to an aspect of the disclosure, it is possible to provide an actuator device that can suppress an increase in the heating amount even though the amount of current input to a coil is increased and can achieve the improvement of reliability and the facilitation of manufacture.

DESCRIPTION OF EMBODIMENTS

Figure 1:
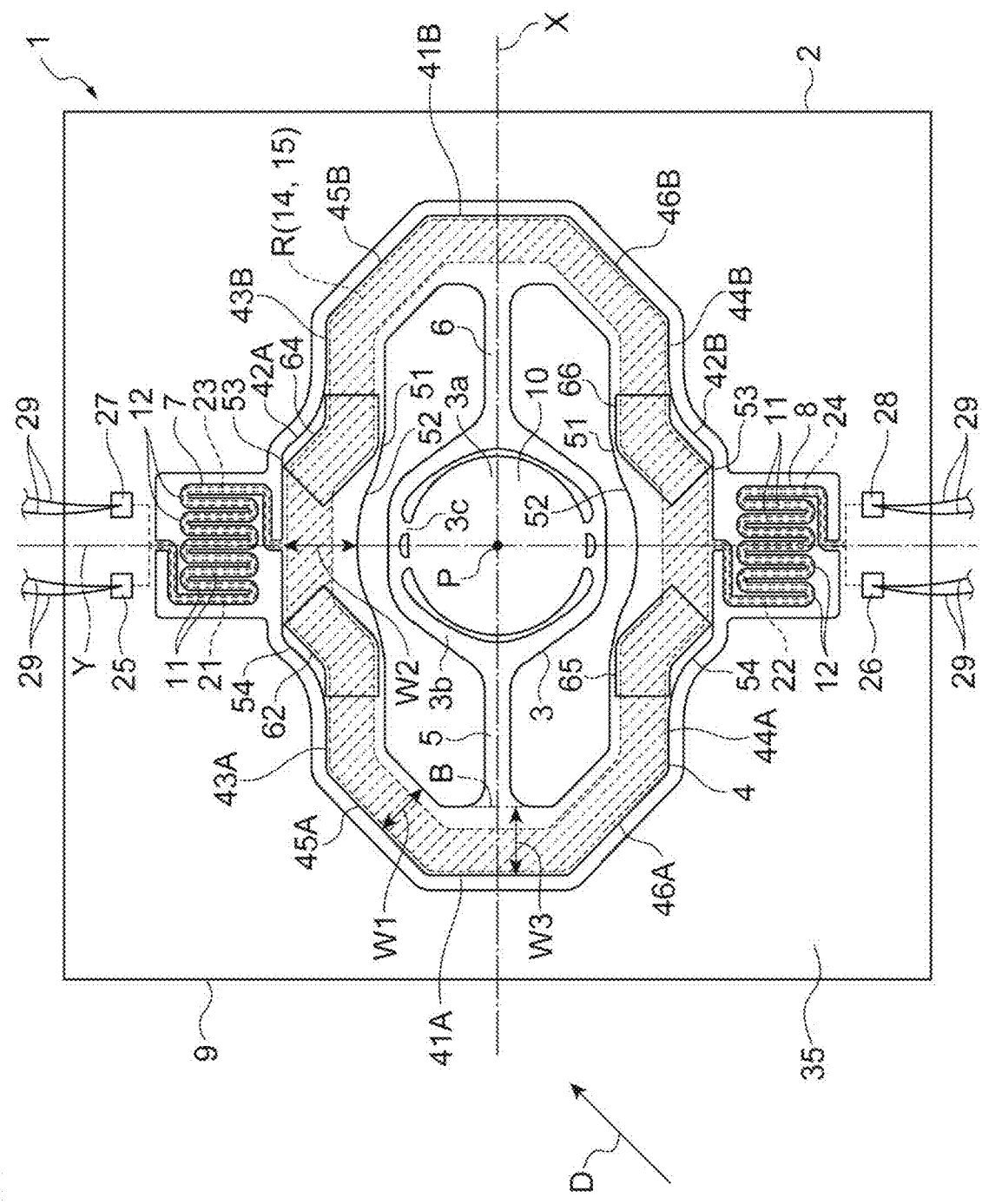
FIG. 1 is a plan view of an actuator device according to an embodiment.

An embodiment of the disclosure will be described in detail below with reference to the drawings. Meanwhile, in the following description, the same or corresponding elements are denoted by the same reference numerals and the repeated description thereof will be omitted.

As illustrated in FIG. 1, an actuator device 1 includes a support part 2, a first movable part 3, a second movable part 4, a pair of first torsion bars 5 and 6, a pair of second torsion bars 7 and 8, and a magnetic field generator 9. The support part 2, the first movable part 3, the second movable part 4, the pair of first torsion bars (first connecting parts) 5 and 6, and the pair of second torsion bars (second connecting parts) 7 and 8 are integrally formed by, for example, a Silicon on Insulator (SOI) substrate. That is, the actuator device 1 is formed of a MEMS device. In the actuator device 1, the first movable part 3 provided with a mirror surface 10 is made to swing around each of an X axis (first axis) and a Y axis (second axis orthogonal to the first axis) orthogonal to each other. The actuator device 1 is used for, for example, an optical switch for optical communication, an optical scanner, and the like. The actuator device 1 is manufactured using a MEMS technology (patterning, etching, and the like).

The magnetic field generator 9 is formed of permanent magnets and the like arranged in a Halbach array. The magnetic field generator 9 generates, for example, a magnetic field in a direction D inclined with respect to each of the X axis and the Y axis by an angle of 45° in plan view (when viewed in a direction orthogonal to the X axis and the Y axis), and causes the magnetic field to act on a coil 14 to be described later. The direction D of the magnetic field generated by the magnetic field generator 9 may be inclined with respect to the X axis and the Y axis by an angle other than 45° in plan view.

The support part 2 has, for example, a rectangular outer shape in plan view and is formed in the shape of a frame. The support part 2 is arranged on one side of the magnetic field generator 9 in the direction orthogonal to the X axis and the Y axis. The first movable part 3 is arranged inside the support part 2 in a state where the first movable part 3 is spaced from the magnetic field generator 9. The first movable part 3 includes a body portion 3$a$, a ring shape portion 3$b$, and a pair of connecting portions 3$c$.

The body portion 3$a$ has a circular shape in plan view, but may be formed in any shape, such as an elliptical shape, a rectangular shape, or a rhombic shape. The center P of the body portion 3$a$ in plan view coincides with the intersection of the X axis and the Y axis. The mirror surface 10 is provided on the surface of the body portion 3$a$ opposite to the magnetic field generator by a metal film made of, for example, aluminum. The mirror surface 10 is provided over the entire surface of the body portion, but may be provided on only a part of the surface of the body portion. The ring shape portion 3$b$ is formed in a ring shape so as to surround the body portion 3$a$ in plan view. The ring shape portion 3$b$ has an octagonal outer shape in plan view, but may have any outer shape, such as a circular shape, an elliptical shape, a rectangular shape, or a rhombic shape. The pair of connecting portions 3$c$ is arranged on both sides of the body portion 3$a$ on the Y axis, and connects the body portion 3$a$ to the ring shape portion 3$b$.

The second movable part 4 is formed in the shape of a frame, and is arranged inside the support part 2 so as to surround the first movable part 3 in a state where the second movable part 4 is spaced from the magnetic field generator 9. The second movable part 4 includes a pair of first connection portions 41A and 41B, a pair of second connection portions 42A and 42B, a pair of first linear portions 43A and 43B, a pair of second linear portions 44A and 44B, a pair of third linear portions 45A and 45B, and a pair of fourth linear portions 46A and 46B. The second movable part 4 has a shape symmetrical with respect to each of the X axis and the Y axis in plan view. In the following description, symmetry with respect to the X axis or the Y axis means symmetry in plan view.

The first connection portions 41A and 41B are positioned on both sides of the first movable part 3 in an X-axis direction (first axis direction) parallel to the X axis. That is, each of the first connection portions 41A and 41B includes a portion facing the first movable part 3 in the X-axis direction in plan view. Each of the first connection portions 41A and 41B extends in a Y-axis direction.

The second connection portions 42A and 42B are positioned on both sides of the first movable part 3 in the Y-axis direction (second axis direction) parallel to the Y axis. That is, each of the second connection portions 42A and 42B includes a portion facing the first movable part 3 in the Y-axis direction in plan view. Each of the second connection portions 42A and 42B extends in the X-axis direction. An inner edge 51 of each of the second connection portions 42A and 42B in plan view includes a depression portion 52 recessed in the Y-axis direction, and an outer edge 53 of each of the second connection portions 42A and 42B in plan view includes a protrusion portion 54 protruding in the Y-axis direction. The depression portion 52 and the protrusion portion 54 are positioned on the Y axis in plan view.

In plan view, the width of each of the second connection portions 42A and 42B is larger than the width (maximum width) W1 of a portion of the second movable part 4 other than the first connection portions 41A and 41B and the second connection portions 42A and 42B. That is, the width of each of the second connection portions 42A and 42B is the minimum width W2 on the Y axis, but the minimum width W2 is larger than the width W1. Further, the minimum width W2 of each of the second connection portions 42A and 42B is larger than the width (maximum width) W3 of each of the first connection portions 41A and 41B. The width W3 of each of the first connection portions 41A and 41B is larger than the width W1, but may be equal to the width W1 or may be smaller than the width W1. A boundary between the first connection portion 41A and the first torsion bar 5 is illustrated in FIG. 1 by a one-dot chain line B. The width of a certain portion of the second movable part 4 is a distance between the inner edge and the outer edge of this portion in plan view, that is, is the width of this portion in a direction (width direction) orthogonal to a direction orthogonal to the X axis and the Y axis and a direction orthogonal to the extending direction of this portion.

The first linear portions 43A and 43B are positioned on both sides of the second connection portion 42A in the X-axis direction, and are connected to the second connection portion 42A. Each of the first linear portions 43A and 43B extends in the X-axis direction. The first linear portions 43A and 43B are arranged symmetrically to each other with respect to the Y axis. The second linear portions 44A and 44B are positioned on both sides of the second connection portion 42B in the X-axis direction, and are connected to the second connection portion 42B. Each of the second linear portions 44A and 44B extends in the X-axis direction. The second linear portions 44A and 44B are arranged symmetrically to each other with respect to the Y axis.

The third linear portions 45A and 45B are positioned on the sides of the respective first linear portions 43A and 43B opposite to the second connection portion 42A, and are connected to the first linear portions 43A and 43B and the first connection portions 41A and 41B. The third linear portion 45A extends in a direction inclined with respect to each of the X axis and the Y axis by an angle of 45° in plan view. The third linear portion 45B extends symmetrically to the third linear portion 45A with respect to the Y axis.

The fourth linear portions 46A and 46B are positioned on the sides of the respective second linear portions 44A and 44B opposite to the second connection portion 42B, and are connected to the second linear portions 44A and 44B and the first connection portions 41A and 41B. The fourth linear portion 46A extends symmetrically to the third linear portion 45A with respect to the X axis. The fourth linear portion 46B extends symmetrically to the fourth linear portion 46A with respect to the Y axis, and extends symmetrically to the third linear portion 45B with respect to the X axis.

The first torsion bars 5 and 6 are arranged on both sides of the first movable part 3 on the X axis. The first torsion bars 5 and 6 connect the first movable part 3 (ring shape portion 3$b$) to the second movable part 4 on the X axis so that the first movable part 3 can swing around the X axis (around the X axis as a center line). The first torsion bars 5 and 6 are connected to the second movable part 4 at the first connection portions 41A and 41B. Each of the first torsion bars 5 and 6 extends linearly along the X axis. In this embodiment, for a reduction in stress acting on the first torsion bars 5 and 6, the width (width in the Y-axis direction) of an end portion of each of the first torsion bars 5 and 6 close to the first movable part 3 increases as approaching the first movable part 3, and the width (width in the Y-axis direction) of an end portion of each of the first torsion bars 5 and 6 close to the second movable part 4 increases as approaching the second movable part 4.

The second torsion bars 7 and 8 are arranged on both sides of the second movable part 4 on the Y axis. The second torsion bars 7 and 8 connect the second movable part 4 to the support part 2 on the Y axis so that the second movable part 4 can swing around the Y axis (around the Y axis as a center line). The second torsion bars 7 and 8 are connected to the second movable part 4 at the second connection portions 42A and 42B. Each of the second torsion bars 7 and 8 extends meanderingly in plan view. Each of the second torsion bars 7 and 8 includes a plurality of linear portions 11 and a plurality of folded portions 12. The linear portions 11 extend in the Y-axis direction, and are arranged side by side in the X-axis direction. The folded portions 12 alternately connect both ends of the adjacent linear portions 11.

The actuator device 1 further includes a pair of coils 14 and 15, a first wiring 21, a second wiring 22, a third wiring 23, a fourth wiring 24, a first external terminal 25, a second external terminal 26, a third external terminal 27, a fourth external terminal 28, and four pairs of wires 29. Each of the coils 14 and 15 is provided in the second movable part 4 so as to surround the first movable part 3, and has a spiral shape in plan view (when viewed in a direction orthogonal to a plane where the respective coils 14 and 15 are arranged). The respective coils 14 and 15 are arranged along a plane including the X axis and the Y axis. Each of the coils 14 and 15 is wound around the first movable part 3 a plurality of times. The pair of coils 14 and 15 is alternately arranged side by side in the width direction of the second movable part 4 in plan view.

An arrangement region R where the coils 14 and 15 are arranged is illustrated in FIG. 1 by hatching. Each of the coils 14 and 15 extends in the extending directions of the first connection portions 41A and 41B and the respective linear portions 43A to 46B at the first connection portions 41A and 41B and the respective linear portions 43A to 46B. At the first connection portions 41A and 41B and the respective linear portions 43A to 46B, the outer edge of the arrangement region R extends along the outer edges of the first connection portions 41A and 41B and the respective linear portions 43A to 46B and the inner edge of the arrangement region R extends along the inner edges of the first connection portions 41A and 41B and the respective linear portions 43A to 46B.

Figure 2:
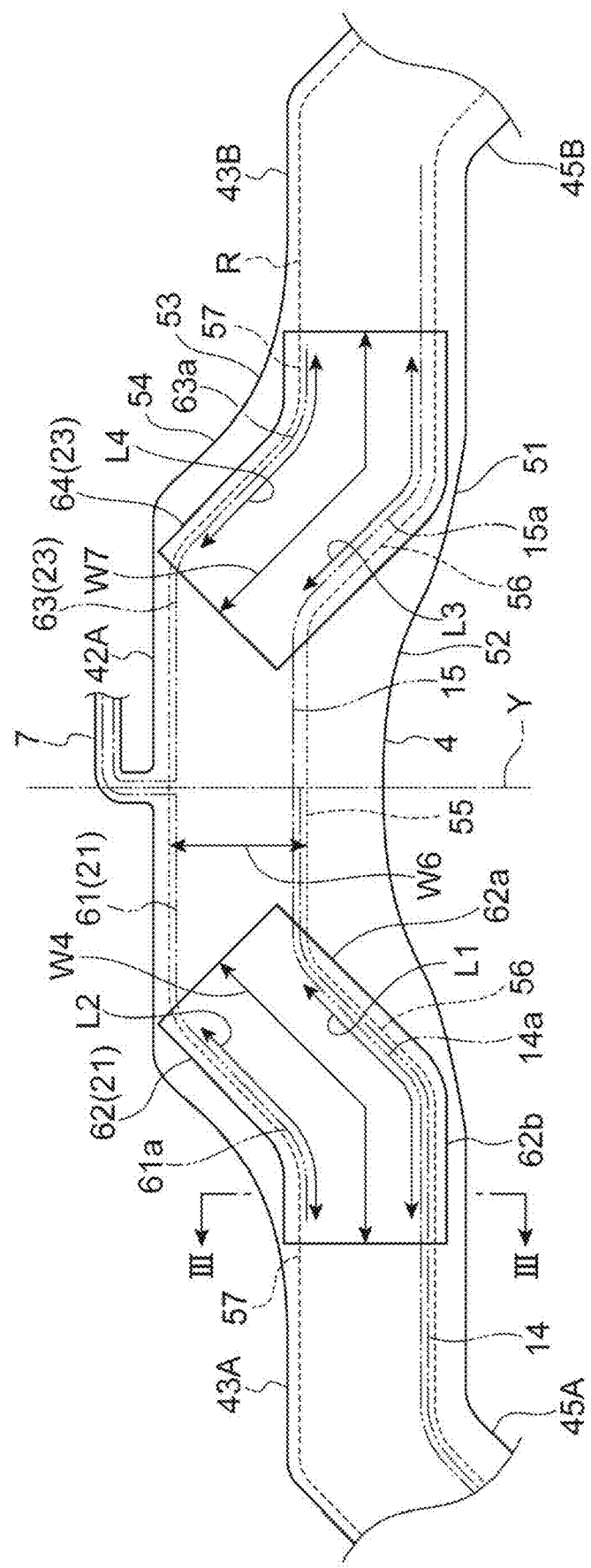
FIG. 2 is an enlarged plan view of a part of FIG. 1.

The arrangement region R in each of the second connection portions 42A and 42B includes a first portion 55, a pair of second portions 56, and a pair of third portions 57 (see FIG. 2). The first portion 55 extends in the X-axis direction, and crosses the Y axis in plan view. The pair of second portions 56 is positioned on both sides of the first portion 55 in the X-axis direction, and is connected to the first portion 55. One second portion 56 extends in the direction inclined with respect to each of the X axis and the Y axis by an angle of 45°. The other second portion 56 extends symmetrically to one second portion 56 with respect to the Y axis. The first portion 55 is arranged at a position closer to the outer edge 53 than the inner edge 51 of the second connection portion 42A. The pair of third portions 57 is positioned on the sides of the respective second portions 56 opposite to the first portion 55, and is connected to the pair of second portions 56 and the arrangement region R in the first linear portions 43A and 43B. Each third portion 57 extends in the X-axis direction. The first movable part 3 is not provided with the coils. A direction where one second portion 56 extends may be inclined with respect to the X axis and the Y axis by an angle other than 45°.

Each of the external terminals 25 to 28 is, for example, an electrode pad provided on the support part 2 and is exposed to the outside from an insulating layer 35. The insulating layer 35 is integrally formed so as to cover the surfaces (surfaces opposite to the magnetic field generator 9) of the support part 2, the first movable part 3, the second movable part 4, the first torsion bars 5 and 6, and the second torsion bars 7 and 8. One pair of wires 29 is electrically connected to each of the external terminals 25 to 28. Each wire 29 is led out of the actuator device 1 to the outside. Each of the external terminals 25 to 28 is electrically connected to a drive source, which is arranged outside the actuator device 1, via the wires 29.

The first wiring 21 is electrically connected to the inner end portion of the coil 14 and the first external terminal 25. The first wiring 21 extends to the first external terminal 25 from the inner end portion of the coil 14 through the second torsion bar 7. The second wiring 22 is electrically connected to the outer end portion of the coil 14 and the second external terminal 26. The second wiring 22 is connected to the outer end portion of the coil 14 on, for example, the Y axis. The second wiring 22 extends to the second external terminal 26 from the outer end portion of the coil 14 through the second torsion bar 8.

The third wiring 23 is electrically connected to the inner end portion of the coil 15 and the third external terminal 27. The third wiring 23 extends to the third external terminal 27 from the inner end portion of the coil 15 through the second torsion bar 7. The fourth wiring 24 is electrically connected to the outer end portion of the coil 15 and the fourth external terminal 28. The fourth wiring 24 is connected to the outer end portion of the coil 15 on, for example, the Y axis. The fourth wiring 24 extends to the fourth external terminal 28 from the outer end portion of the coil 15 through the second torsion bar 8.

In the actuator device 1 having the above-mentioned configuration, when a drive signal for a linear operation is input to the coil 14 through the respective external terminals 25 and 26 and the respective wirings 21 and 22, Lorentz force acts on the coil 14 due to an interaction between the drive signal and the magnetic field generated by the magnetic field generator 9. The mirror surface 10 (first movable part 3) can be linearly operated around the Y axis together with the second movable part 4 using a balance between the Lorentz force and the elastic forces of the second torsion bars 7 and 8.

On the other hand, when a drive signal for a resonant operation is input to the coil 15 through the respective external terminals 27 and 28 and the respective wirings 23 and 24, Lorentz force acts on the coil 15 due to an interaction between the drive signal and the magnetic field generated by the magnetic field generator 9. The mirror surface 10 (first movable part 3) can be operated to resonate around the X axis using the resonance of the first movable part 3 at a resonant frequency in addition to the Lorentz force. Specifically, when a drive signal having a frequency equal to the resonant frequency of the first movable part 3 around the X axis is input to the coil 15, the second movable part 4 slightly vibrates around the X axis at this frequency. This vibration is transmitted to the first movable part 3 through the first torsion bars 5 and 6, so that the first movable part 3 can swing around the X axis at this frequency.

Subsequently, a connection state of the coil 14 and the first wiring 21 and a connection state of the coil 15 and the third wiring 23 will be described in detail with reference to FIGS. 1 to 3. As illustrated in FIG. 2, an inner end portion 14a of the coil 14 extends to the Y axis on the second connection portion 42A. The first wiring 21 includes a lead wiring 61 and a straddle wiring 62. The lead wiring 61 is provided over the second movable part 4, the second torsion bar 7, and the support part 2, and is electrically connected to the first external terminal 25. The lead wiring 61 at the second movable part 4 is arranged closer to the outside than the coils 14 and 15 in plan view, and extends to an end portion of the second connection portion 42A close to the first linear portion 43A. An end portion 61a of the lead wiring 61 opposite to the first external terminal 25 faces the inner end portion 14a of the coil 14 in the width direction of the second movable part 4.

The straddle wiring 62 is provided on the second movable part 4, and is electrically connected to the inner end portion 14a of the coil 14 and the end portion 61a of the lead wiring 61. The straddle wiring 62 is formed in the shape of a flat layer, and extends so as to straddle the upper side (one side of the coils 14 and 15 in the direction orthogonal to the X axis and the Y axis) of the coils 14 and 15. That is, the straddle wiring 62 three-dimensionally crosses the coils 14 and 15. The straddle wiring 62 is arranged at the end portion of the second connection portion 42A close to the first linear portion 43A so as to overlap with the end portion 61a of the lead wiring 61 and the inner end portion 14a of the coil 14 in plan view, and covers a part of the arrangement region R in the extending direction of the coils 14 and 15. The straddle wiring 62 is illustrated in FIGS. 1 and 2 by a solid line, but is actually covered with the insulating layer 35.

The straddle wiring 62 includes a first portion 62a and a second portion 62b connected to the first portion 62a. The first portion 62a is positioned on one of the second portions 56 of the arrangement region R, and extends in the direction inclined with respect to each of the X axis and the Y axis by an angle of 45°. The second portion 62b is positioned on one of the third portions 57 of the arrangement region R, and extends in the X-axis direction. A direction where the first portion 62a extends may be inclined with respect to the X axis and the Y axis by an angle other than 45°.

Figure 3:
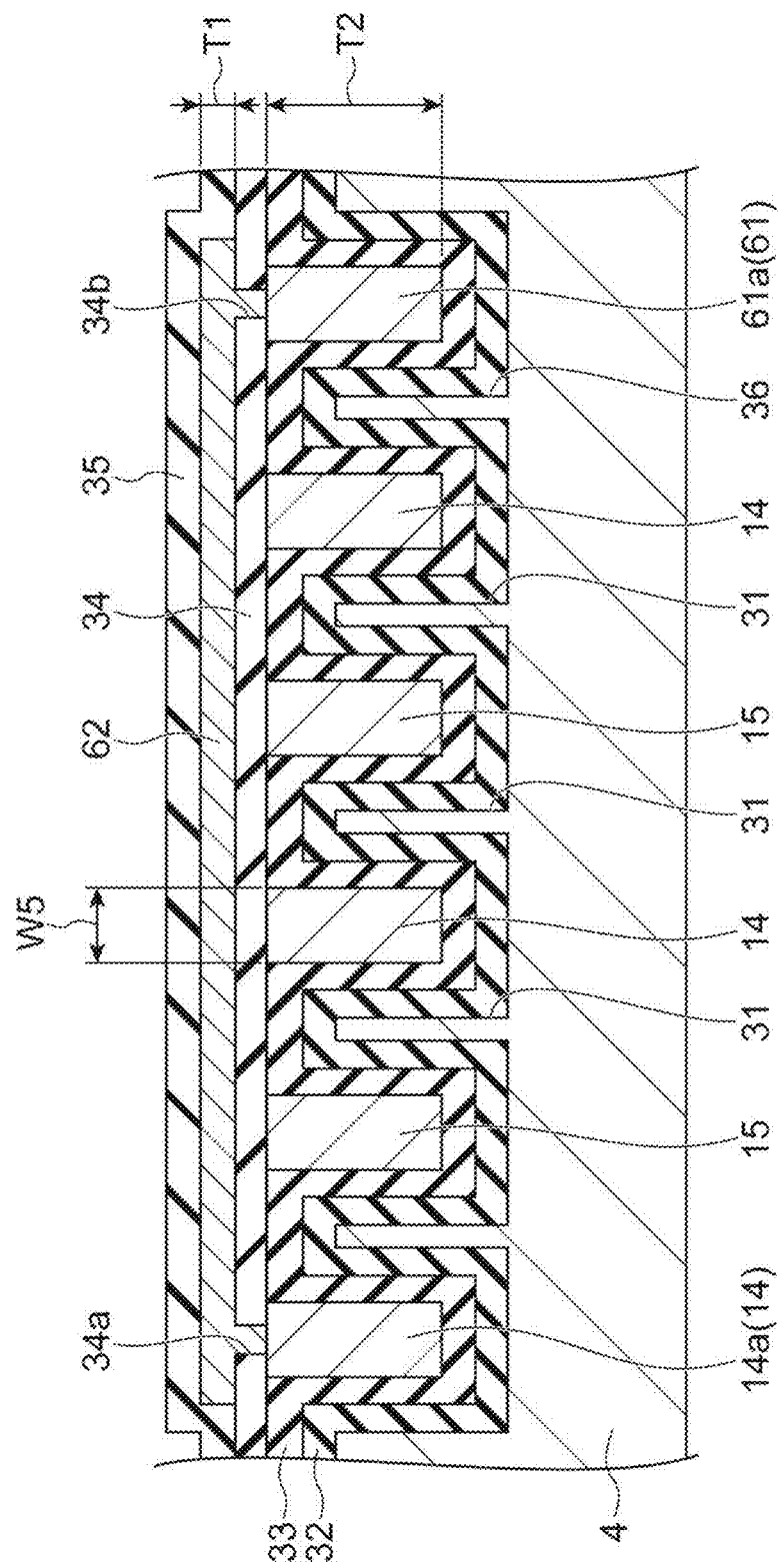
FIG. 3 is a cross-sectional view taken along line III-III illustrated in FIG. 2.

FIG. 3 is a cross-sectional view taken along line III-III illustrated in FIG. 2. As illustrated in FIG. 3, the second movable part 4 is provided with groove portions 31 having shapes corresponding to the coils 14 and 15. An insulating layer 32 is provided on the inner surfaces of the groove portions 31, and an insulating layer 33 is provided on the insulating layer 32. Each of the coils 14 and 15 is arranged in the groove portion 31 via the insulating layers 32 and 33. That is, each of the coils 14 and 15 is embedded in the second movable part 4. Each of the coils 14 and 15 is a damascene wiring formed by, for example, a damascene method so that a metal material, such as copper, is embedded in the groove portion 31. An insulating layer 34 is provided so as to cover the coils 14 and 15 and the insulating layer 33. An insulating layer 35 is provided on the insulating layer 34. Each of the insulating layers 32 to 35 is made of, for example, silicon oxide, silicon nitride, silicon oxynitride, or the like. Each of the insulating layers 32 to 35 is integrally formed so as to cover the surfaces (surfaces opposite to the magnetic field generator 9) of the support part 2, the first movable part 3, the second movable part 4, the pair of first torsion bars 5 and 6, and the pair of second torsion bars 7 and 8.

The lead wiring 61 is, for example, a damascene wiring formed in the same manner as the coils 14 and 15. That is, the second movable part 4 is provided with a groove portion 36, and the lead wiring 61 is arranged in the groove portion 36 via the insulating layers 32 and 33. The lead wiring 61 is embedded in the second movable part 4, and is covered with the insulating layers 34 and 35. The lead wiring 61 has the same cross-sectional shape as the cross-sectional shape of each of the coils 14 and 15, but may have a cross-sectional shape different from the cross-sectional shape of each of the coils 14 and 15. The lead wiring 61 may be made of the same metal material as the metal material of each of the coils 14 and 15, but may be made of a metal material different from the metal material of each of the coils 14 and 15.

The straddle wiring 62 is provided on the insulating layer 34, and is covered with the insulating layer 35. The insulating layer 34 is provided with an opening 34a formed at a position corresponding to the inner end portion 14a of the coil 14 in plan view, and is provided with an opening 34b formed at a position corresponding to the end portion 61a of the lead wiring 61 in plan view. The straddle wiring 62 enters the respective openings 34a and 34b, and is connected to the inner end portion 14a and the end portion 61a through the openings 34a and 34b. The straddle wiring 62 is made of a metal material (for example, aluminum or an aluminum-based alloy) different from the metal material of the lead wiring 61, but may be made of the same metal material as the metal material of the lead wiring 61.

The width W4 of the straddle wiring 62 is larger than the width W5 of each of the coils 14 and 15. Further, the width W4 of the straddle wiring 62 is larger than the width W6 of the arrangement region R of the coils 14 and 15 (the total width of the coils 14 and 15). The width W4 of the straddle wiring 62 is, for example, not less than 5 times and not more than 100 times the width W5 of each of the coils 14 and 15. The width W4 of the straddle wiring 62 is the width of the straddle wiring 62 in a direction orthogonal to a direction from an end of the straddle wiring 62 that is connected to the inner end portion 14a of the coil 14 toward an end of the straddle wiring 62 that is connected to the end portion 61a of the lead wiring 61. In other words, the width W4 of the straddle wiring 62 is the width of the straddle wiring 62 in the extending direction of the coils 14 and 15. When the straddle wiring 62 includes the first and second portions 62a and 62b extending in directions different from each other as in this embodiment, the width W4 of the straddle wiring 62 is the sum of the width of the first portion 62a and the width of the second portion 62b. The same applies to a straddle wiring 64 to be described later. The width of each of the coils 14 and 15 is the width of one conductor, which forms each of the coils 14 and 15, in a direction orthogonal to the extending direction of the coils 14 and 15. The widths of the coils 14 and 15 are equal to each other in this embodiment, but may be different from each other.

The thickness T1 of the straddle wiring 62 is smaller than the thickness T2 of each of the coils 14 and 15. The cross-sectional area of the straddle wiring 62 is larger than the cross-sectional area of each of the coils 14 and 15. The thickness of the straddle wiring 62 or the coils 14 and 15 is the thickness of the straddle wiring 62 or the coils 14 and 15 in a direction orthogonal to a plane where the coils 14 and 15 are arranged. The thicknesses of the coils 14 and 15 are equal to each other in this embodiment, but the thicknesses of the coils 14 and 15 may be different from each other. The cross-sectional area of the straddle wiring 62 is the cross-sectional area of the straddle wiring 62 in a cross-section orthogonal to the direction from the end of the straddle wiring 62 that is connected to the inner end portion 14a of the coil 14 toward the end of the straddle wiring 62 that is connected to the end portion 61a of the lead wiring 61. In other words, the cross-sectional area of the straddle wiring 62 is the cross-sectional area of the straddle wiring 62 in a cross-section orthogonal to the width direction of the second movable part 4. In this embodiment, the cross-sectional area of the straddle wiring 62 is the sum of the cross-sectional area of the first portion 62a and the cross-sectional area of the second portion 62b. The same applies to a straddle wiring 64 to be described later. The cross-sectional area of each of the coils 14 and 15 is the cross-sectional area of each of the coils 14 and 15 in a cross-section orthogonal to the extending direction of the coils 14 and 15.

The length L1 of a contact region between the straddle wiring 62 and the coil 14 is larger than the width W5 of each of the coils 14 and 15. That is, the opening 34a is provided in the insulating layer 34 over a range denoted in FIG. 2 by reference numeral L1, and the straddle wiring 62 and the coil 14 are in contact with each other in the range. The contact region between the straddle wiring 62 and the coil 14 extends in the extending direction of the coils 14 and 15. The length L2 of a contact region between the straddle wiring 62 and the lead wiring 61 is larger than the width W5 of each of the coils 14 and 15. That is, the opening 34b is provided in the insulating layer 34 over a range denoted in FIG. 2 by reference numeral L2, and the straddle wiring 62 and the lead wiring 61 are in contact with each other in the range. The contact region between the straddle wiring 62 and the lead wiring 61 extends in the extending direction of the coils 14 and 15.

The connection state of the third wiring 23 and the coil 15 is the same as the connection state of the first wiring 21 and the coil 14. As illustrated in FIG. 2, an inner end portion 15a of the coil 15 extends to the vicinity of a boundary between the first linear portion 43B and the third linear portion 45B. The third wiring 23 includes a lead wiring 63 and a straddle wiring 64. The lead wiring 63 is provided over the second movable part 4, the second torsion bar 7, and the support part 2, and is electrically connected to the third external terminal 27. The lead wiring 63 of the second movable part 4 is arranged closer to the outside than the coils 14 and 15 in plan view, and extends to an end portion of the second connection portion 42A close to the first linear portion 43B. An end portion 63a of the lead wiring 63 opposite to the third external terminal 27 faces the inner end portion 15a of the coil 15 in the width direction of the second movable part 4. The lead wiring 63 is formed of a damascene wiring as with the lead wiring 61.

The straddle wiring 64 is provided on the second movable part 4, and is electrically connected to the inner end portion 15a of the coil 15 and the end portion 63a of the lead wiring 63. The straddle wiring 64 is formed in the shape of a flat layer, and extends so as to straddle the upper side of the coils 14 and 15. The straddle wiring 64 is arranged at the end portion of the second connection portion 42A close to the first linear portion 43B so as to overlap with the end portion 63a of the lead wiring 63 and the inner end portion 15a of the coil 15 in plan view, and covers a part of the arrangement region R in the extending direction of the coils 14 and 15. The straddle wiring 64 is arranged symmetrically to the straddle wiring 62 with respect to the Y axis. As with the straddle wiring 62, the straddle wiring 64 is connected to the inner end portion 15a and the end portion 63a through openings provided in the insulating layer 35. The straddle wiring 64 is illustrated in FIGS. 1 and 2 by a solid line, but is actually covered with the insulating layer 35.

The width W7 of the straddle wiring 64 is larger than the width W5 of each of the coils 14 and 15. Further, the width W7 of the straddle wiring 64 is larger than the width W6 of the arrangement region R of the coils 14 and 15. The thickness of the straddle wiring 64 is equal to the thickness T1 of the straddle wiring 62, and is smaller than the thickness T2 of each of the coils 14 and 15. The cross-sectional area of the straddle wiring 64 is larger than the cross-sectional area of each of the coils 14 and 15.

The length L3 of a contact region between the straddle wiring 64 and the coil 15 is larger than the width W5 of each of the coils 14 and 15. The length L4 of a contact region between the straddle wiring 64 and the lead wiring 61 is larger than the width W5 of each of the coils 14 and 15. Each of the second and fourth wirings 22 and 24 is formed of a damascene wiring similarly to the lead wirings 61 and 63 for example.

As illustrated in FIG. 1, the second movable part 4 is provided with a pair of dummy straddle wirings 65 and 66. The dummy straddle wiring 65 is arranged point symmetrically to the straddle wiring 64 with respect to the center of the second movable part 4 in plan view. The dummy straddle wiring 65 is provided to adjust a mass balance and a stiffness balance with the straddle wiring 64. The dummy straddle wiring 66 is arranged point symmetrically to the straddle wiring 62 with respect to the center of the second movable part 4 in plan view. The dummy straddle wiring 66 is provided to adjust a mass balance and a stiffness balance with the straddle wiring 62. In this embodiment, the center of the second movable part 4 in plan view coincides with the center P of the body portion 3a (the intersection of the X axis and the Y axis).

The dummy straddle wirings 65 and 66 have configurations corresponding to the straddle wirings 62 and 64. That is, each of the dummy straddle wirings 65 and 66 is formed in the shape of a flat layer, and is arranged between the insulating layers 34 and 35 so as to straddle the upper side of the coils 14 and 15. However, each of the dummy straddle wirings 65 and 66 is not electrically connected to the coils 14 and 15. That is, the openings 34a and 34b are not provided in the insulating layer 34 at positions where the dummy straddle wirings 65 and 66 are formed.

Figure 4:
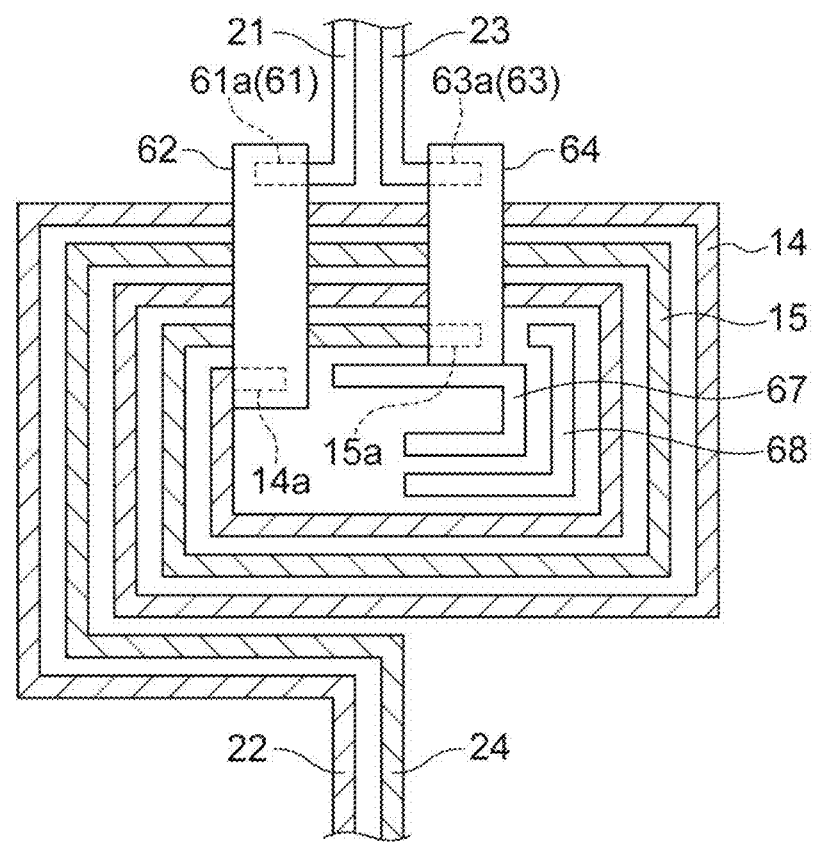
FIG. 4 is a schematic diagram for describing dummy coils.
Figure 5:
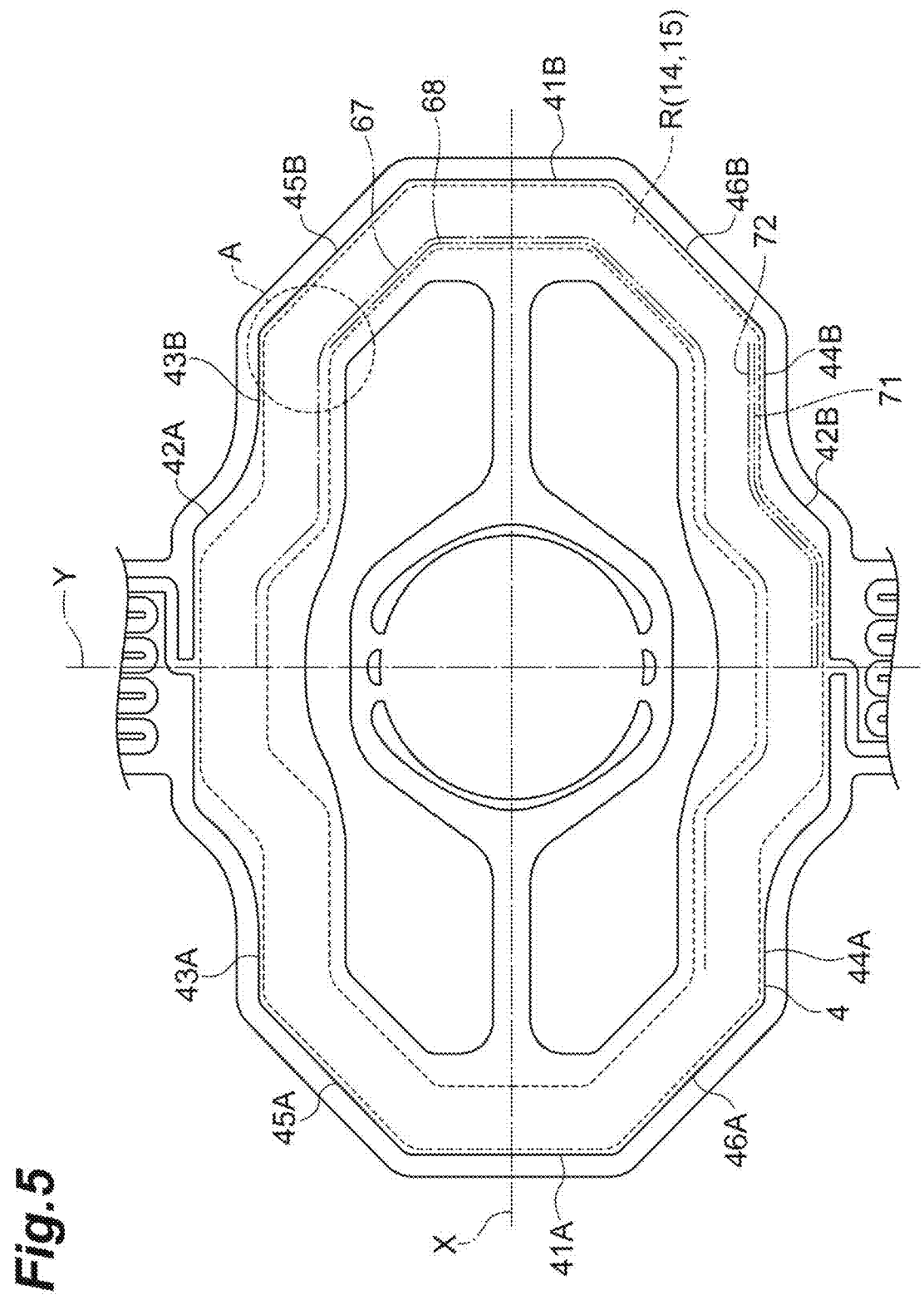
FIG. 5 is a plan view schematically illustrating a position where the dummy coils are arranged.
Figure 6:
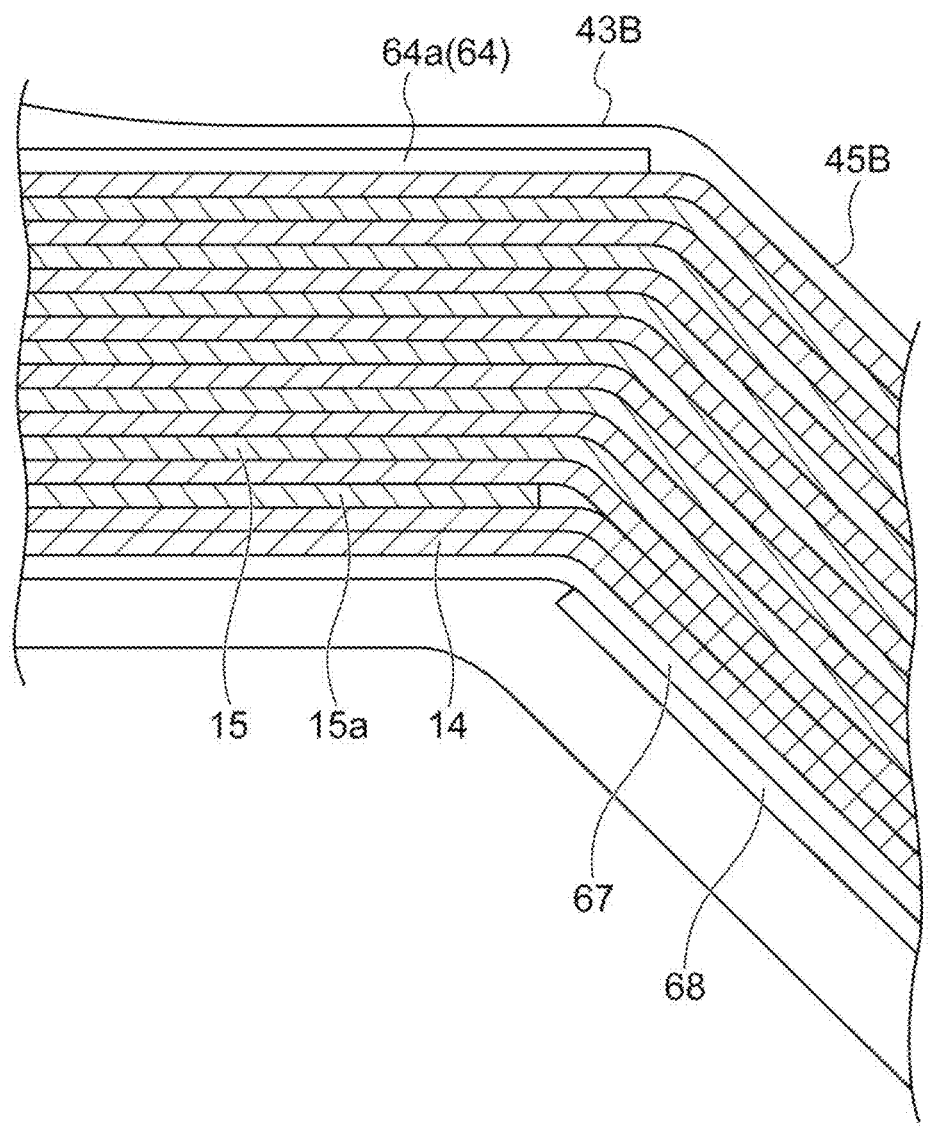
FIG. 6 is an enlarged plan view of a portion denoted in FIG. 5 by reference character A.

As illustrated in FIGS. 4 to 6, the second movable part 4 is provided with a pair of dummy coils 67 and 68 and a pair of dummy coils 71 and 72. The coils 14 and 15 are hatched in FIGS. 4 and 6, but FIGS. 4 and 6 do not illustrate a cross-section.

The dummy coil 67 is arranged at a position to which the coil 14 virtually extends spirally from the inner end portion 14a. The dummy coil 67 is provided to adjust a mass balance and a stiffness balance with the coil 14. The dummy coil 67 has a configuration corresponding to the coil 14, and is embedded in the second movable part 4. The dummy coil 67 is not electrically connected to the coil 14, but may be electrically connected to the coil 14. As illustrated in FIG. 5, the dummy coil 67 extends to the vicinity of a boundary between the second and fourth linear portions 44A and 46A from the Y axis on the second connection portion 42A through the first linear portion 43B, the third linear portion 45B, the first connection portion 41B, the fourth linear portion 46B, the second linear portion 44B, the second connection portion 42B, and the second linear portion 44A.

The dummy coil 68 is arranged at a position to which the coil 15 virtually extends spirally from the inner end portion 15a. The dummy coil 68 is provided to adjust a mass balance and a stiffness balance between itself and the coil 15. The dummy coil 68 has a configuration corresponding to the coil 15, and is embedded in the second movable part 4. The dummy coil 68 is not electrically connected to the coil 15, but may be electrically connected to the coil 15. As illustrated in FIG. 5, the dummy coil 68 extends to the vicinity of a boundary between the second and fourth linear portions 44B and 46B from the vicinity of an end portion of the third linear portion 45B, which is close to the first linear portion 43B, through the first connection portion 41B and the fourth linear portion 46B.

As illustrated in FIG. 5, the dummy coil 71 is arranged symmetrically to the outer end portion of the coil 14 with respect to the Y axis in plan view. The dummy coil 71 is provided to adjust a mass balance and a stiffness balance with the coil 14. The dummy coil 71 has a configuration corresponding to the coil 14, and is embedded in the second movable part 4. The dummy coil 71 is not electrically connected to the coil 14, but may be electrically connected to the coil 14. The dummy coil 72 is arranged symmetrically to the outer end portion of the coil 15 with respect to the Y axis in plan view. The dummy coil 72 is provided to adjust a mass balance and a stiffness balance with the coil 15. The dummy coil 72 has a configuration corresponding to the coil 15, and is embedded in the second movable part 4. The dummy coil 72 is not electrically connected to the coil 15, but may be electrically connected to the coil 15.

As illustrated in FIG. 6, the coil 14 is wound around the first movable part 3 a plurality of times at a position closer to the inside than the inner end portion 15a of the coil 15. The reason for this is that the amount of current input to the coil 14 is different from the amount of current input to the coil 15 and the number of turns of the coil 14 is larger than the number of turns of the coil 15. At a position closer to the inside than the inner end portion 15a of the coil 15, the coil 14 is arranged not only at a position where the coil 14 should be originally arranged but also at a position to which the coil 15 virtually extends spirally from the inner end portion 15a. In other words, the coil 14 is arranged even in an empty space that is formed since the coil 15 does not extend. The respective dummy coils 67 and 68 are arranged closer to the inside than the coils 14 and 15 in plan view.

Figure 7:
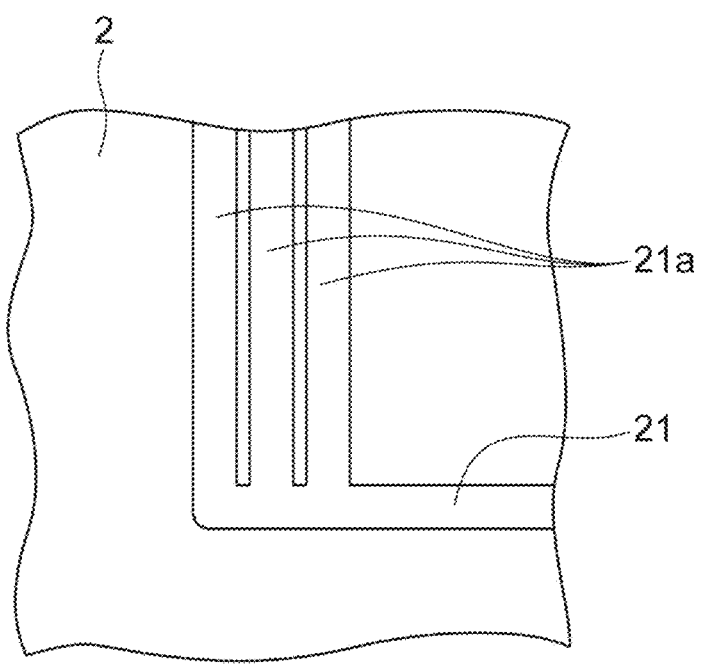
FIG. 7 is a plan view illustrating a portion of a support part positioned near a first wiring.

As illustrated in FIG. 7, the first wiring 21 (lead wiring 61) at the support part 2 includes a plurality of (in this example, three) wiring portions 21a that are connected in parallel to each other. The wiring portions 21a are formed in, for example, a linear shape and are arranged side by side so as to be adjacent to each other in the width direction. Each wiring portion 21a is formed of a damascene wiring, but may be a wire arranged on the surface of the support part 2. Although not illustrated, each of the wirings 22 to 24 of the support part 2 includes a plurality of (in this example, three) wiring portions that are connected in parallel to each other similarly to the first wiring 21.

As described above, in the actuator device 1, the inner end portion 14a of the coil 14 and the lead wiring 61 are connected to each other by the straddle wiring 62 that is provided on the second movable part 4 so as to straddle the coils 14 and 15. The width W4 of the straddle wiring 62 is larger than the width W5 of each of the coils 14 and 15, and the thickness T1 of the straddle wiring 62 is smaller than the thickness T2 of each of the coils 14 and 15. Likewise, the inner end portion 15a of the coil 15 and the lead wiring 63 are connected to each other by the straddle wiring 64 that is provided on the second movable part 4 so as to straddle the coils 14 and 15. The width W7 of the straddle wiring 64 is larger than the width W5 of each of the coils 14 and 15, and the thickness of the straddle wiring 64 is smaller than the thickness T2 of each of the coils 14 and 15. Accordingly, since the wiring resistance of the straddle wirings 62 and 64 can be reduced, an increase in the heating amount can be suppressed even though the amounts of current input to the coils 14 and 15 are increased. Further, since the width W4 of the straddle wiring 62 and the width W7 of the straddle wiring 64 are larger than the width W5 of each of the coils 14 and 15 and the ground contact areas of the straddle wirings 62 and 64 are large, the separation of the straddle wirings 62 and 64 can be suppressed. As a result, since the straddle wirings 62 and 64 can be stably arranged, reliability can be improved. Furthermore, since the thickness T1 of each of the straddle wirings 62 and 64 is smaller than the thickness T2 of each of the coils 14 and 15, the formation of irregularities on the surface of the second movable part 4 caused by the straddle wirings 62 and 64 can be suppressed. Accordingly, reliability can be improved and manufacture can be facilitated. Therefore, according to the actuator device 1, an increase in the heating amount can be suppressed even though the amounts of current input to the coils 14 and 15 are increased, and manufacture can be facilitated. Meanwhile, when the width W4 of the straddle wiring 62 and the width W7 of the straddle wiring 64 are large and the areas of the straddle wirings 62 and 64 in plan view are large, since parasitic capacitance is increased, there is a possibility that spike noise is generated during driving. However, good characteristics are obtained in the actuator device 1 by an intentional increase in the width W4 of the straddle wiring 62 and the width W7 of the straddle wiring 64.

In the actuator device 1, the length L1 of the contact region between the coil 14 and the straddle wiring 62 is larger than the width W5 of each of the coils 14 and 15. Likewise, the length L3 of the contact region between the coil 15 and the straddle wiring 64 is larger than the width W5 of each of the coils 14 and 15. Accordingly, contact resistance between the coils 14 and 15 and the straddle wirings 62 and 64 can be reduced, so that an increase in the heating amount can be effectively suppressed.

In the actuator device 1, the length L3 of the contact region between the lead wiring 61 and the straddle wiring 62 is larger than the width W5 of each of the coils 14 and 15. Likewise, the length L4 of the contact region between the lead wiring 63 and the straddle wiring 64 is larger than the width W5 of each of the coils 14 and 15. Accordingly, contact resistance between the lead wirings 61 and 63 and the straddle wirings 62 and 64 can be reduced, so that an increase in the heating amount can be effectively suppressed.

In the actuator device 1, the cross-sectional areas of the straddle wirings 62 and 64 are larger than the cross-sectional areas of the coils 14 and 15. Accordingly, an increase in the heating amount can be still more effectively suppressed.

In the actuator device 1, the width W4 of the straddle wiring 62 and the width W7 of the straddle wiring 64 are larger than the width W6 of the arrangement region R of the coils 14 and 15. Accordingly, an increase in the heating amount can be still more effectively suppressed.

Since the coils 14 and 15 are embedded in the second movable part 4 in the actuator device 1, the respective straddle wirings 62 and 64 are formed in the shape of a flat layer and extend so as to straddle the upper side of the coils 14 and 15. Accordingly, since the coils 14 and 15 can be stably arranged, reliability can be further improved. Further, since the formation of irregularities on the surface of the second movable part 4 caused by the straddle wiring 62 can be effectively suppressed, manufacture can be further facilitated. Furthermore, since a process for planarizing the surfaces of the second movable part 4 and the coils 14 and 15 can be performed after the coils 14 and 15 are embedded in the second movable part 4, the straddle wirings 62 and 64 can be formed on the flat surface. Accordingly, manufacture can be further facilitated. Even though the surfaces of the second movable part 4 and the coils 14 and 15 are planarized, there is a case where irregularities slightly remain on the surfaces. In the actuator device 1, even though the straddle wirings 62 and 64 are formed on such irregularities, since the width W4 of the straddle wiring 62 and the width W7 of the straddle wiring 64 are larger than the width W5 of each of the coils 14 and 15 and the ground contact areas of the straddle wirings 62 and 64 are large, the separation of the straddle wirings 62 and 64 can be suppressed. Accordingly, the straddle wirings 62 and 64 can be stably arranged.

In the actuator device 1, the first wiring 21 extends to the first external terminal 25 from the inner end portion 14*a* of the coil 14 through the second torsion bar 7 and the second wiring 22 extends to the second external terminal 26 from the outer end portion of the coil 14 through the second torsion bar 8. Accordingly, since the first wiring 21 passes through the second torsion bar 7 and the second wiring 22 passes through the second torsion bar 8, the heating amount can be uniformized between the second torsion bars 7 and 8 in comparison with, for example, a case where both the first wiring 21 and the second wiring 22 pass through the second torsion bar 7. As a result, a change in the natural frequency or stiffness of the second movable part 4 caused by the deviation of heat distribution can be suppressed.

In the actuator device 1, the second movable part 4 is provided with the dummy coil 67, which is provided at a position to which the coil 14 virtually extends spirally from the inner end portion 14*a*, and adjusts a mass balance with the coil 14, and the dummy coil 68, which is provided at a position to which the coil 15 virtually extends spirally from the inner end portion 15*a*, and adjusts a mass balance with the coil 15. Accordingly, the mass balance and the stiffness balance of the second movable part 4 can be improved.

In the actuator device 1, the second movable part 4 is provided with the dummy straddle wiring 65 for adjusting a mass balance with the straddle wiring 62 and the dummy straddle wiring 66 for adjusting a mass balance with the straddle wiring 64. Accordingly, the mass balance and the stiffness balance of the second movable part 4 can be improved.

In the actuator device 1, the dummy straddle wiring 65 is arranged at a position symmetrical to the straddle wiring 62 with respect to the center of the second movable part 4 in plan view. Likewise, the dummy straddle wiring 66 is arranged at a position symmetrical to the straddle wiring 64 with respect to the center of the second movable part 4 in plan view. Accordingly, the mass balance and the stiffness balance of the second movable part 4 can be effectively improved.

In the actuator device 1, the pair of coils 14 and 15 is alternately arranged side by side in the width direction of the second movable part 4 in plan view. Accordingly, the first movable part 3 can be suitably driven.

In the actuator device 1, the coil 14 is arranged at a position to which the coil 15 virtually extends spirally from the inner end portion 15*a*. Accordingly, the coil 14 can be arranged closer to the outside, so that a driving force can be increased.

In the actuator device 1, the second torsion bars 7 and 8 connect the second movable part 4 to the support part 2 so that the second movable part 4 can swing around the Y axis. Accordingly, the second movable part 4 can swing around the Y axis together with the first movable part 3.

In the actuator device 1, the first wiring 21 of the support part 2 includes the plurality of wiring portions 21*a* that are connected in parallel to each other. Accordingly, since the wiring resistance of the first wiring 21 of the support part 2 can be reduced, an increase in the heating amount can be still more effectively suppressed.

The actuator device 1 includes four pairs of wires 29 that are connected to the external terminals 25 to 28, respectively, and lead to the outside. Accordingly, since the wiring resistance of the wires led out of the respective external terminals 25 to 28 can be reduced, an increase in the heating amount can be still more effectively suppressed.

Figure 8:
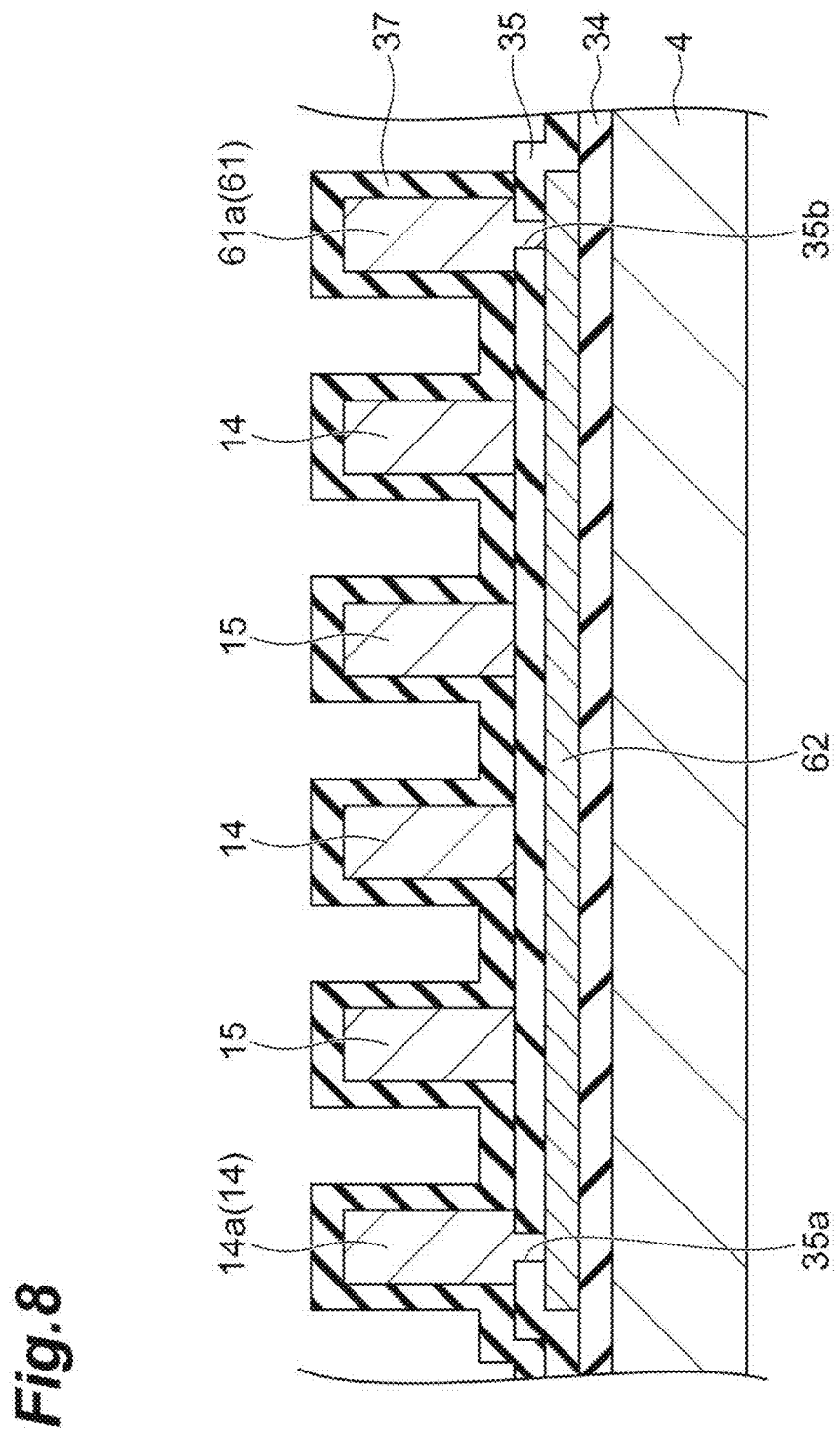
FIG. 8 is a cross-sectional view illustrating a modification.

One embodiment of the disclosure has been described above, but the disclosure is not limited to the embodiment. As in a modification illustrated in, for example, FIG. 8, the coils 14 and 15 and the lead wiring 61 may be arranged on the second movable part 4. In this modification, the insulating layer 34 is provided on the surface of the second movable part 4 and the straddle wiring 62 is provided on the insulating layer 34. The insulating layer 35 is provided on the insulating layer 34 so as to cover the straddle wiring 62. The coils 14 and 15 and the lead wiring 61 are provided on the insulating layer 35. That is, the coils 14 and 15 are arranged on the second movable part 4 via the insulating layers 34 and 35, and the straddle wiring 62 extends between the coils 14 and 15 and the second movable part 4 so as to straddle the lower side of the coils 14 and 15.

The insulating layer 35 is provided with an opening 35*a* formed at a position corresponding to the inner end portion 14*a* of the coil 14 in plan view, and is provided with an opening 35*b* formed at a position corresponding to the end portion 61*a* of the lead wiring 61 in plan view. The straddle wiring 62 enters the respective openings 35*a* and 35*b*, and is connected to the inner end portion 14*a* and the end portion 61*a* through the openings 35*a* and 35*b*. An insulating layer 37 is provided on the insulating layer 35 so as to cover the respective coils 14 and 15 and the lead wiring 61. The insulating layer 37 is provided to protect the respective coils 14 and 15 and the lead wiring 61. When the respective coils 14 and 15 and the lead wiring 61 are made of, for example, a corrosion-resistant metal material, such as gold, the insulating layer 35 may not be provided. As with the straddle wiring 62, the straddle wiring 64 is also arranged between the coils 14 and 15 and the second movable part 4 so as to straddle the lower side of the coils 14 and 15.

Even in this modification, as in the embodiment, an increase in the heating amount can be suppressed even though the amounts of current input to the coils 14 and 15 are increased, and reliability can be improved and manufacture can be facilitated. Further, since the coils 14 and 15 are arranged on the second movable part 4 and the straddle wirings 62 and 64 extend between the coils 14 and 15 and the second movable part 4 so as to straddle the lower side of the coils 14 and 15, the straddle wirings 62 and 64 can be protected. Furthermore, since the thickness T1 of each of the straddle wirings 62 and 64 is smaller than the thickness T2 of each of the coils 14 and 15, the coils 14 and 15 can be easily formed so as to straddle the upper side of the straddle wirings 62 and 64. As a result, since the occurrence of damage or the like (for example, cracks) to the coils 14 and 15 can be suppressed, the reliability of the coils 14 and 15 can be improved.

The first and second movable parts 3 and 4 are linearly operated around the Y axis in the embodiment, but the first and second movable parts 3 and 4 may be operated to resonate around the Y axis. The second movable part 4 is provided with the pair of coils 14 and 15 in the embodiment, but the second movable part 4 may be provided with only one coil. Even in this case, the first movable part 3 can swing around the X axis and the second movable part 4 can swing around the Y axis by the input of a drive signal to the coil. When the second movable part 4 is provided with only the coil 14, the respective wirings 23 and 24 and the respective external terminals 27 and 28 will be omitted, but a dummy straddle wiring for adjusting a mass balance with the straddle wiring 62 may be provided at a position where the straddle wiring 64 is arranged in the embodiment. That is, the second movable part 4 may be provided with a dummy straddle wiring at a position symmetrical to the straddle wiring 62 with respect to the Y axis in plan view. In the embodiment, the second movable part 4 may be provided with an electromotive force-monitoring coil for measuring an electromotive force and the support part 2 may be provided with a temperature sensor coil for measuring a temperature.

The first movable part 3 is made to swing around each of the X axis and the Y axis in the embodiment, but the actuator device 1 may be adapted so that the first movable part 3 swings around only the X axis. In this case, the second connecting part may not be a part that can be torsionally deformed like the second torsion bars 7 and 8, and may be a part that connects the second movable part 4 to the support part 2 so that the first movable part 3 can swing around the X axis by the vibration of the second movable part 4 (so that at least the second movable part 4 can vibrate around the X axis). The degree of freedom in the design of this second connecting part is relatively high. For example, the second connecting part may be a pair of members that is arranged on both sides of the second movable part 4 on the Y axis and is connected to the second movable part 4 and the support part 2 on the Y axis, or may be a plurality of pairs of members that are connected to the second movable part 4 and the support part 2 at positions on the Y axis and/or at positions other than the positions on the Y axis. Alternatively, the second connecting part may be a pair of members that is arranged on both sides of the second movable part 4 on the X axis and is connected to the second movable part 4 and the support part 2 on the X axis. In these cases, the second movable part 4 is provided with one coil. The first movable part 3 can swing around the X axis by the input of a drive signal to the coil.

When the second movable part 4 is provided with only the coil 14, the first wiring 21 may pass through the second torsion bar 7 and the second wiring 22 may pass through the second torsion bar 8. However, both the first wiring 21 and the second wiring 22 may pass through the second torsion bar 7. In this case, the dummy coil 67 can be omitted. At least one of the width W4 of the straddle wiring 62 and the width W7 of the straddle wiring 64 may be smaller than the width W6 of the arrangement region R of the coils 14 and 15. At least one of the length L1 of the contact region between the coil 14 and the straddle wiring 62, the length L2 of the contact region between the lead wiring 61 and the straddle wiring 62, the length L3 of the contact region between the coil 15 and the straddle wiring 64, and the length L4 of the contact region between the lead wiring 63 and the straddle wiring 64 may be smaller than the width W5 of each of the coils 14 and 15.

The material and shape of each component are not limited to the above-mentioned material and shape, and various materials and shapes can be employed. For example, each of the straddle wirings 62 and 64 may include only a portion extending in one direction and the shapes and arrangement of the straddle wirings 62 and 64 are not limited to the above-mentioned example. The second movable part 4 may have a substantially circular shape, a substantially elliptical shape, a substantially rectangular shape, a substantially rhombic shape, or the like in plan view. The ring shape portion 3b may not be provided and the first torsion bars 5 and 6 may be directly connected to the body portion 3a. The second torsion bars 7 and 8 may extend linearly in plan view. The second torsion bars 7 and 8 may connect the second movable part 4 to the support part 2 at positions other than the positions on the Y axis so that the second movable part 4 can swing around the Y axis. At least one of the dummy straddle wirings 65 and 66 and the dummy coils 67 and 68 may not be provided. The actuator device 1 may be a device to drive a portion other than the mirror surface 10. The pair of coils 14 and 15 is alternately arranged side by side in the embodiment, but one of the coils 14 and 15 may be arranged inside the other thereof in plan view. Three or more wires 29 may be connected to the first external terminal 25. In the modification, the straddle wiring 62 may be provided so as to straddle the upper side of the coils 14 and 15 provided in the second movable part. In the embodiment, the first movable part 3 is made to swing by the vibration of the second movable part 4. However, the first movable part 3 may be provided with a coil and may be made to directly swing by Lorentz force acting on the coil. Even in this case, an increase in the heating amount can be suppressed as in the embodiment.

REFERENCE SIGNS LIST

1: actuator device, 2: support part, 3: first movable part, 4: second movable part, 5, 6: first torsion bar (first connecting part), 7, 8: second torsion bar (second connecting part), 9: magnetic field generator, 14, 15: coil, 21: first wiring, 21a: wiring portion, 22: second wiring, 25: first external terminal, 26: second external terminal, 29: wire, 61, 63: lead wiring, 62, 64: straddle wiring, 65, 66: dummy straddle wiring, 67, 68: dummy coil.

The invention claimed is:
1. An actuator device comprising:
a support part;
a first movable part;
a second movable part formed in a frame shape and arranged so as to surround the first movable part;
a first connecting part connecting the first movable part to the second movable part so that the first movable part can swing around a first axis;
a second connecting part connecting the second movable part to the support part so that the first movable part can swing around the first axis by vibrating the second movable part;
a spiral coil provided to the second movable part;
a magnetic field generator that generates a magnetic field to act on the coil;
a first external terminal provided to the support part; and
a first wiring connected to an inner end portion of the coil and the first external terminal,
wherein the first wiring includes a lead wiring connected to the first external terminal, and a straddle wiring provided to the second movable part so as to straddle the coil and connected to the inner end portion of the coil and the lead wiring,
a width of the straddle wiring is larger than a width of the coil, and
a thickness of the straddle wiring is smaller than a thickness of the coil.
2. The actuator device according to claim 1,
wherein a length of a contact region between the coil and the straddle wiring is larger than the width of the coil.

3. The actuator device according to claim 1,
wherein a length of a contact region between the lead wiring and the straddle wiring is larger than the width of the coil.

4. The actuator device according to claim 1,
wherein a cross-sectional area of the straddle wiring is larger than a cross-sectional area of the coil.

5. The actuator device according to claim 1,
wherein the width of the straddle wiring is larger than a width of an arrangement region of the coil.

6. The actuator device according to claim 1,
wherein the coil is embedded in the second movable part, and
the straddle wiring is formed in a shape of a flat layer, and extends so as to straddle the upper side of the coil.

7. The actuator device according to claim 1, further comprising:
a second external terminal provided on the support part; and
a second wiring connected to an outer end portion of the coil and the second external terminal,
wherein the actuator device includes a pair of the second connecting parts,
the first wiring extends to the first external terminal from the inner end portion of the coil through one of the pair of the second connecting parts, and
the second wiring extends to the second external terminal from the outer end portion of the coil through the other of the pair of the second connecting parts.

8. The actuator device according to claim 1,
wherein the second connecting part connects the second movable part to the support part so that the second movable part can swing around a second axis orthogonal to the first axis.

9. The actuator device according to claim 1,
wherein the first wiring at the support part includes a plurality of wiring portions connected in parallel to each other.

10. The actuator device according to claim 1, further comprising:
a pair of wires connected to the first external terminal and leading to an outside.

11. The actuator device according to claim 1,
wherein the coil is arranged on the second movable part, and
the straddle wiring extends between the coil and the second movable part so as to straddle the lower side of the coil.

12. The actuator device according to claim 11,
wherein the second movable part is provided with a dummy coil for adjusting a mass balance with the coil at a position to which the coil virtually extends spirally from the inner end portion.

13. The actuator device according to claim 1,
wherein the second movable part is provided with a dummy straddle wiring for adjusting a mass balance with the straddle wiring.

14. The actuator device according to claim 13,
wherein the dummy straddle wiring is arranged symmetrically to the straddle wiring with respect to the center of the second movable part when viewed in a direction orthogonal to a plane where the coil is arranged.

15. The actuator device according to claim 1,
wherein the actuator device includes a pair of the coils, and
the pair of the coils is alternately arranged side by side in a width direction of the second movable part when viewed in a direction orthogonal to a plane where the coils are arranged.

16. The actuator device according to claim 15,
wherein one of the pair of the coils is arranged at a position to which the other of the pair of the coils virtually extends spirally from the inner end portion.

* * * * *